United States Patent
Jadhav et al.

(10) Patent No.: US 12,266,608 B2
(45) Date of Patent: Apr. 1, 2025

(54) INTEGRATED PHOTONICS AND PROCESSOR PACKAGE WITH REDISTRIBUTION LAYER AND EMIB CONNECTOR

(71) Applicant: Intel Corporation, Santa Clara, CA (US)

(72) Inventors: Susheel Jadhav, Chandler, AZ (US); Kenneth Brown, Tempe, AZ (US); David Hui, Santa Clara, CA (US); Ling Liao, Fremont, CA (US); Syed S. Islam, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 543 days.

(21) Appl. No.: 17/104,963

(22) Filed: Nov. 25, 2020

(65) Prior Publication Data

US 2021/0407909 A1    Dec. 30, 2021

Related U.S. Application Data

(60) Provisional application No. 63/044,242, filed on Jun. 25, 2020.

(51) Int. Cl.
*H01L 23/538*  (2006.01)
*G02B 6/42*    (2006.01)
(Continued)

(52) U.S. Cl.
CPC ......... *H01L 23/5381* (2013.01); *G02B 6/423* (2013.01); *G02B 6/4268* (2013.01);
(Continued)

(58) Field of Classification Search
CPC ..... H01L 23/5381; H01L 25/18; H01L 25/50; H10K 19/00; H10K 59/90; H10K 59/95;
(Continued)

(56) References Cited

U.S. PATENT DOCUMENTS

| 10,535,595 | B2 | 1/2020 | Sankman |
| 10,672,712 | B2 | 2/2020 | Bhagavat |

(Continued)

FOREIGN PATENT DOCUMENTS

| TW | 201943038 A | 11/2019 |
| TW | 202013641 A | 4/2020 |

OTHER PUBLICATIONS

Search Report from European Patent Application No. 21160017.6, mailed Jul. 26, 2021, 9 pgs.
(Continued)

*Primary Examiner* — Timor Karimy
(74) *Attorney, Agent, or Firm* — Schwabe, Williamson & Wyatt, P.C.

(57) ABSTRACT

Embodiments described herein may be related to apparatuses, processes, and techniques related to packages that include CPUs and PICs electrically coupled via an interconnect bridge. In embodiments, the PIC are electrically coupled with the EMIB using a fan out RDL to extend reach of the PIC electrical connectors. EICs may be electrically coupled between the PIC and the interconnect bridge. The CPUs may be CPUS, graphical processing units (GPUs), field programmable gate arrays (FPGAs), or other processors. Other embodiments may be described and/or claimed.

12 Claims, 11 Drawing Sheets

(51) Int. Cl.
*H01L 25/00* (2006.01)
*H01L 25/18* (2023.01)

(52) U.S. Cl.
CPC ............ *G02B 6/4274* (2013.01); *H01L 25/18* (2013.01); *H01L 25/50* (2013.01)

(58) Field of Classification Search
CPC ...... G02B 6/423; G02B 6/4268; H10B 80/00; H10N 19/00; H10N 39/00; H10N 59/00; H10N 79/00; H10N 89/00
See application file for complete search history.

(56) References Cited

U.S. PATENT DOCUMENTS

| | | |
|---|---|---|
| 2014/0064659 A1 | 3/2014 | Doerr et al. |
| 2014/0321803 A1 | 10/2014 | Thacker et al. |
| 2015/0098677 A1 | 4/2015 | Thacker et al. |
| 2016/0085038 A1 | 3/2016 | Decker et al. |
| 2016/0216445 A1 | 7/2016 | Thacker et al. |
| 2017/0194309 A1 | 7/2017 | Evans et al. |
| 2018/0299628 A1* | 10/2018 | Liu ..................... H01L 25/167 |
| 2019/0041594 A1* | 2/2019 | Li ........................... H04B 10/40 |
| 2019/0324223 A1* | 10/2019 | Yim ...................... H04B 10/60 |
| 2020/0006088 A1 | 1/2020 | Yu et al. |
| 2020/0153515 A1* | 5/2020 | Goergen ............... G01J 1/4257 |
| 2021/0167016 A1* | 6/2021 | Lu ....................... H01L 25/0657 |

OTHER PUBLICATIONS

Lee Hyung-Jin et al: "Multi-die Integration Using Advanced Packaging Technologies", 2020 IEEE Custom Integrated Circuits Conference (CICC), IEEE, Mar. 22, 2020 (Mar. 22, 2020), pp. 1-7, XP033762109, DOI: 10.1109/CICC48029.2020.9075901 [retrieved on Apr. 21, 2020].

Office Action from European Patent Application No. 21160017.6, mailed Feb. 17, 2023, 9 pgs.

Office Action from European Patent Application No. 202044054204, mailed Mar. 17, 2022, 8 pgs.

Office Action from Taiwan Patent Application No. 109142290, mailed Jun. 11, 2024, 10 pgs.

Office Action from Japanese Patent Application No. 2020-211227, mailed Jan. 14, 2025, 11 pgs.

* cited by examiner

INTEGRATED PHOTONICS AND PROCESSOR PACKAGE WITH REDISTRIBUTION LAYER AND EMIB CONNECTOR

RELATED APPLICATION

This application claims priority to U.S. Provisional Application No. 63/044,242, filed Jun. 25, 2020, titled "OPTICAL IO PACKAGING ARCHITECTURE SCHEME USING FORDL/EMIB PACKAGING." The specification of this provisional application is hereby incorporated by reference in its entirety.

FIELD

Embodiments of the present disclosure generally relate to the field of semiconductor packaging, and in particular to packages that include a photonic integrated circuit (PIC).

BACKGROUND

Continued growth in virtual machines and cloud computing will continue to increase the demand for computing devices that include PICs.

DETAILED DESCRIPTION

Figure 1:
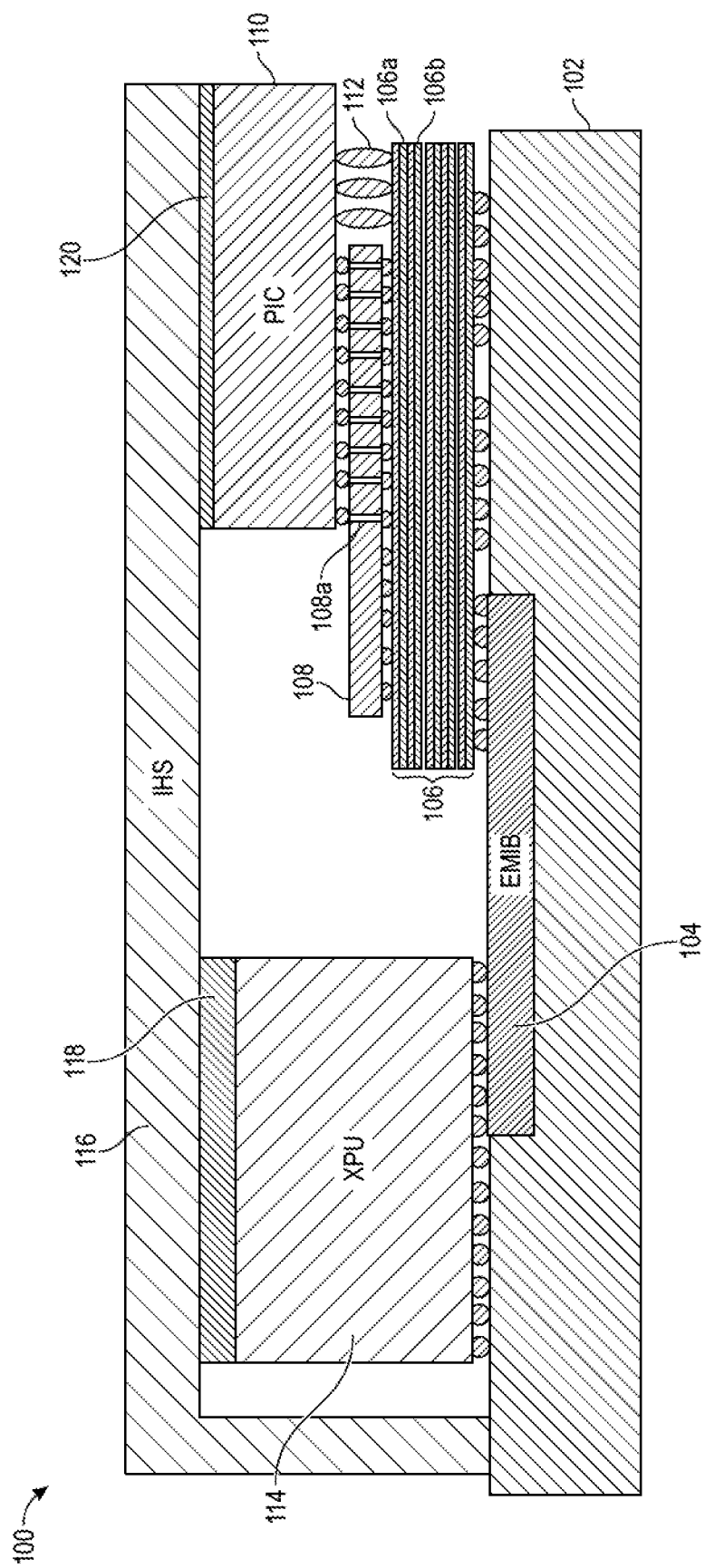
FIG. 1 illustrates a cross-section of an example integrated PIC and a processor IC package, in accordance with various embodiments.

Embodiments described herein include packages that include CPUs and PICs that are electrically coupled via an interconnect bridge, described herein in embodiments as an EMIB. In embodiments, the interconnect bridge may be a bridge die. In some embodiments, the bridge die may have overlying build-up or substrate layers. In some embodiments, the bridge die may not have overlapping build-up or substrate layers. In embodiments, the bridge die may be a EMIB. In embodiments, the interconnect bridge may be an open cavity bridge (OCB), where the OCB is disposed in a cavity at an upper surface of a package substrate. In embodiments, the OCB may not have overlying build-up layers. In embodiments, interconnect bridge may not be embedded into a substrate or other component. References herein that refer to an EMIB may also refer to any implementation of an interconnect bridge.

In embodiments, the PIC is electrically coupled with the EMIB using a FORDL to extend the reach of electrical connectors of the PICs. In other embodiments, EICs are electrically coupled between the PIC and the EMIB, to support operation of the PIC. In embodiments, the CPUs may be graphical processing units (GPUs), field programmable gate arrays (FPGAs), and the like. It should be noted that herein the term photonics IC and PIC may be used interchangeably.

Future generations of processors, such as CPUs, GPU's, FPGAs, or other specialized processors, will use input output (I/O) bandwidths of many terabits per second, at distances reaching up to 100 m and beyond. Silicon photonics, which in legacy applications are used in data center communications, may be used to meet these I/O bandwidth and reach requirements.

Embodiments described herein include apparatus, systems, packages, and techniques to integrate logic ICs and PICs on a same package, to bring the benefits of optical conductivity to processors and to solve I/O bottlenecks with single packages. These embodiments enable optical I/O packaging interconnect technology to bring capabilities of logic (CMOS) and photonics within the same package. The optical I/O package can provide high-bandwidth and long reach conductivity, for example up to 100 m, which is not available in legacy implementations.

Legacy solutions include using electrical I/O. However, this approach is difficult to scale to meet ever-increasing bandwidth and reach needs. For example, parallel I/O using EMIB provides only a 0.3 to 5 mm reach. Serial I/O, such as PCIe, provides only up to 300 mm reach before power-hungry retimers are needed.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates a cross-section of an example integrated PIC and a processor IC package, in accordance with various embodiments. Package 100 includes a substrate 102 that may be a standard silicon substrate with one or more routing layers. An EMIB 104 may be coupled with the substrate 102, and used to electrically couple an XPU 114 with a PIC 110. In embodiments, the EMIB 104 may be recessed into the substrate 102 as shown. In embodiments, the XPU 114 may be one or more CPUs, GPUs, FPGAs, logic ICs, I/O processors, or other specialized processors.

A redistribution layer (RDL) is electrically coupled with the EMIB 104 and the PIC 110. In embodiments, the RDL 106 may include multiple layers 106a, 106b, that may include metal layers for electrical routing interleaved with dielectric layers. In embodiments, there may be three layers to the RDL 106. In embodiments, the RDL 106 may include other features such as vias (not shown). Importantly, in embodiments the RDL 106 may be a fan out RDL (FORDL) that may be used to expand the area footprint of electrical connections from the PIC 110 coupled with the RDL 106 beyond the footprint of the PIC 110. In addition to electrically coupling with the EMIB 104, the RDL 106 may also directly electrically couple with the substrate 102.

In embodiments, an EIC 108 may be electrically coupled between the RDL 106 and the PIC 110. The EIC 108 may include various electrical components to facilitate operation of the PIC 110. These may include a transimpedance amplifier (TIA), clock and data recovery (CDR), and one or more drivers (DRV). In embodiments, a TIA may be a current into voltage converter that may be implemented with one or more operational amplifiers. The TIA may be used to amplify the current output of a photodetector of a PIC, or other types of sensors, to a usable voltage. The TIA may present a low impedance to a photodiode within a PIC 110 and isolates it from output voltage of the operational amplifier.

In embodiments, CDR in serial communications of digital data may extract timing and data information from a serial data stream. In embodiments, some high-speed serial data streams are sent without an accompanying clock signal. A CDR generates a clock from an appropriate frequency reference, and then phase aligns the clock to the transitions in the data stream. In embodiments, the drivers may be used to drive various aspects of the PIC 110.

These functions of the EIC 108 include, but are not limited to, driving processing, cleaning signals to and from the PIC 110, and providing necessary voltage to the PIC 110. The EIC 108 may include copper pillars 108a and/or vias to electrically couple the RDL 106 with the PIC 110. In embodiments, copper pillars 112 may be used to electrically couple the PIC 110 with the RDL 106.

In embodiments, an integrated heat spreader (IHS) 116 may be thermally coupled with the XPU 114 and the PIC 110. This thermal coupling may be accomplished using a thermal interface material (TIM) 118, 120. In embodiments, the TIM 118, 120 may be a polymer TIM, thermal grease, or gap pad.

Figure 2:
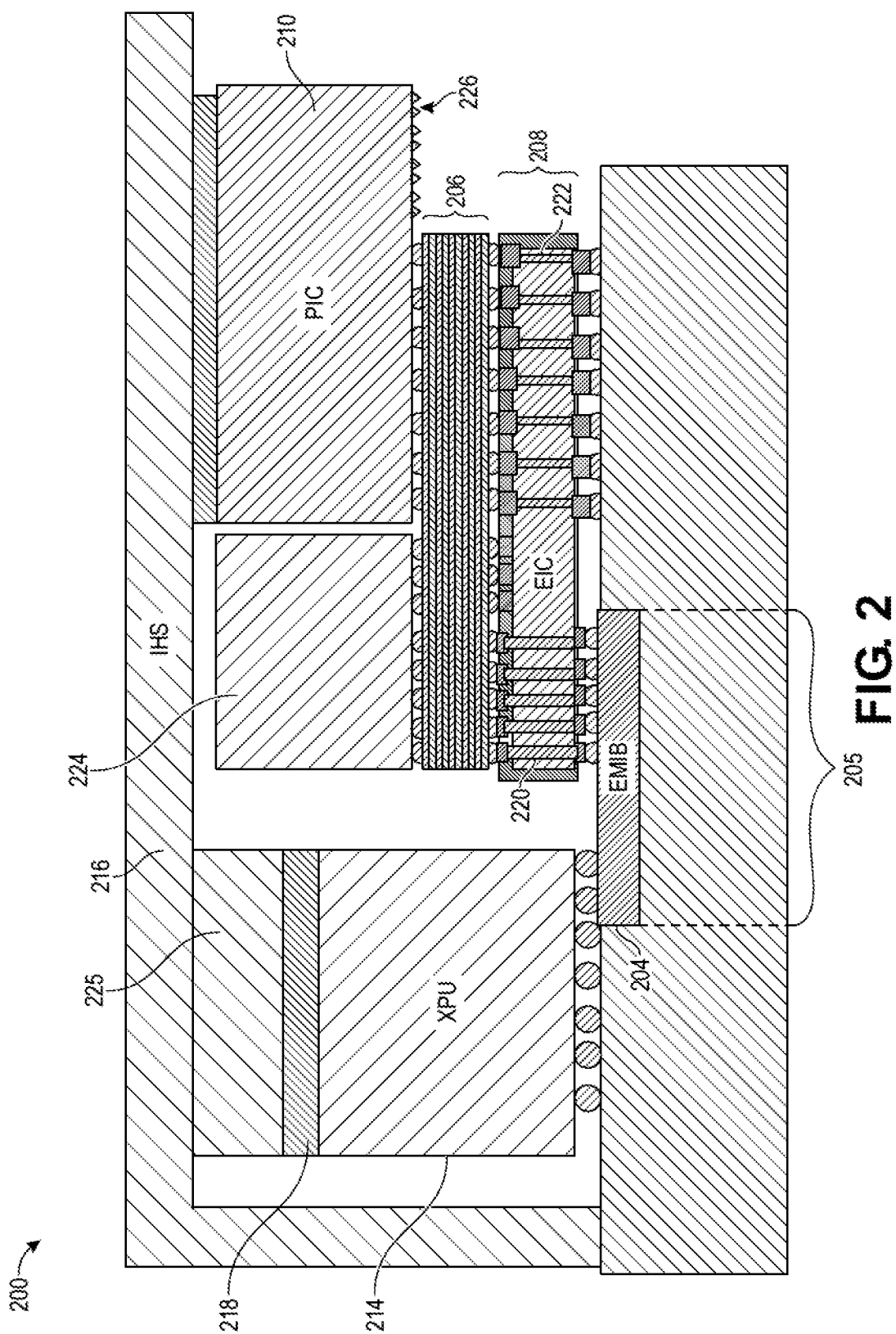
FIG. 2 illustrates a cross-section of an example integrated PIC and processor IC package that includes a dummy die, in accordance with various embodiments.

FIG. 2 illustrates a cross-section of an example integrated PIC and processor IC package that includes a dummy die, in accordance with various embodiments. Package 200 may be similar to package 100 of FIG. 1, with PIC 210 electrically coupled with XPU 214 via EMIB 204, which may be similar, respectively, to PIC 110, XPU 114, and EMIB 104. However, with package 200, the positions of the RDL 206, which may be similar to RDL 106 of FIG. 1, and the EIC 208, which may be similar to EIC 108 of FIG. 1, are flipped. The RDL 206 is directly electrically coupled with the PIC 210. As shown, another die 224, which may be a dummy die or a microcontroller die, is also directly electrically coupled with the RDL 206. In embodiments, the other die 224 may provide controller functions to operate various subcomponents of the PIC 210, for example ring modulation, heating, and the like. In embodiments, the other die 224 may provide flash memory for the EIC 208.

In embodiments, EIC 208 may include copper pillars 220, but which may be used for providing power or for signaling, as well as through silicon vias (TSV) 222 that may be used for signaling. As shown, a dimension 205 of the EMIB 204 may extend only partially into the EIC 208.

As shown, the PIC 210 may be aligned so that it overlaps the RDL 206. This overlap may allow the PIC 210 to include "V" grooves 226 that may be used for aligning one or more optical fibers for entry into the PIC 210. With respect to package 200, a thermal block 225 may also be used to thermally couple heat from the XPU 214 through the TIM 218, and to the IHS 216, which may be similar to IHS 116 of FIG. 1. In embodiments, there may also be a TIM material (not shown but similar to TIM 218) to thermally couple the other die 224 with the IHS 216.

Figure 3:
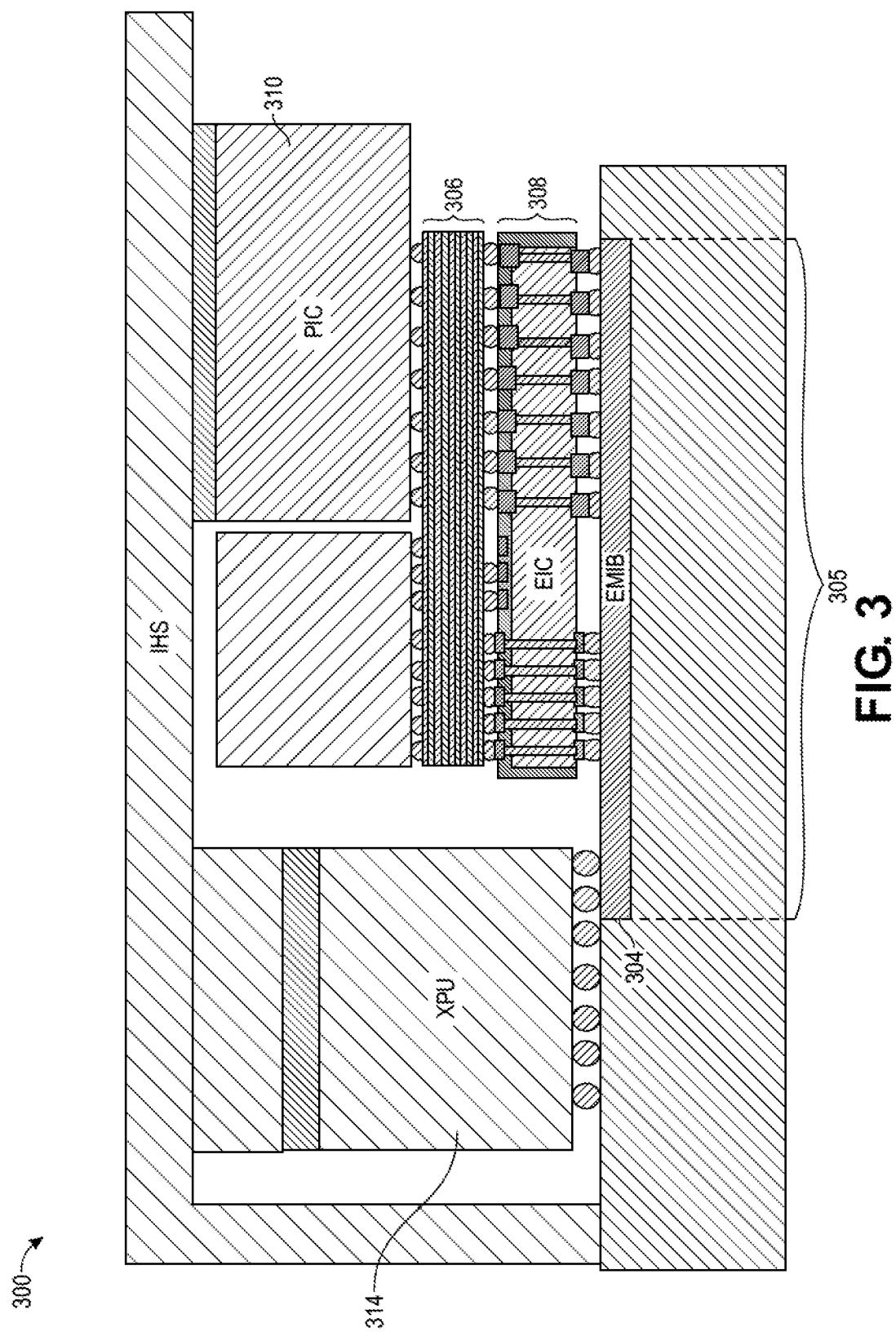
FIG. 3 illustrates a cross-section of an example integrated PIC and processor IC package that includes a dummy die and an extended EMIB, in accordance with various embodiments.

FIG. 3 illustrates a cross-section of an example integrated PIC and processor IC package that includes a dummy die and an extended EMIB, in accordance with various embodiments. Package 300 may be similar to package 200 of FIG. 2. However, unlike the EMIB 204 of FIG. 2, EMIB 304 extends a distance 305 through the length of the EIC 308. In embodiments, this may allow additional electrical connections between the PIC 310 and the XPU 314.

Figure 4:
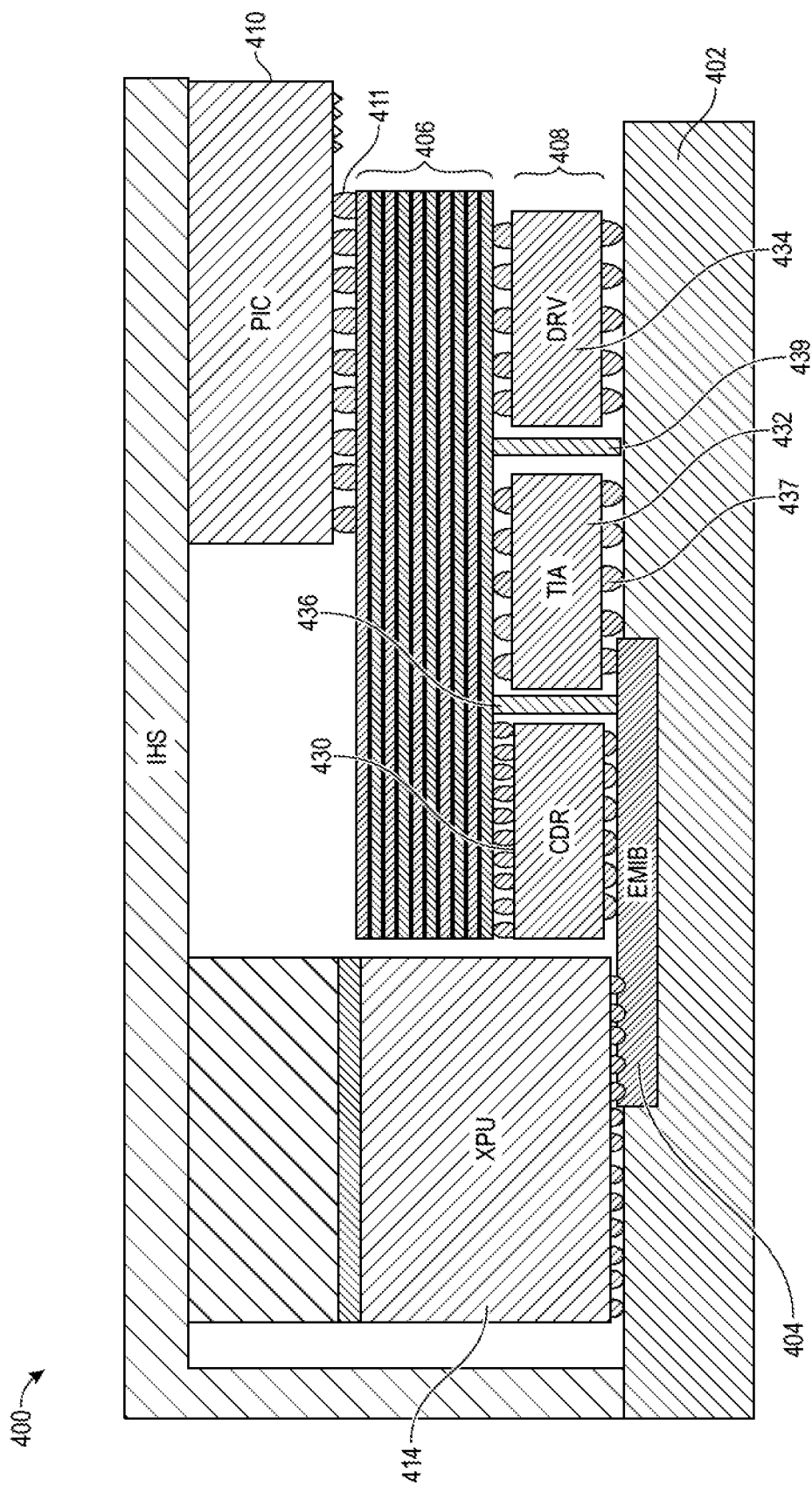
FIG. 4 illustrates a cross-section of an example integrated PIC and processor IC package that includes an electrical integrated circuit (EIC) in discreet components, in accordance with various embodiments.

FIG. 4 illustrates a cross-section of an example integrated PIC and processor IC package that includes an EIC in discreet components, in accordance with various embodiments. Package 400 may be similar to package 200 of FIG. 2. However, unlike the EIC 208 of FIG. 2, EIC 408 has been split into discrete components, the CDR 430, TIA 432, and DRV 434, in embodiments with features as discussed above. The EMIB 404, which may be similar to EMIB 204, electrically couples the PIC 410, which may be similar to PIC 210 of FIG. 2, with the XPU 414, which may be similar to XPU 214 of FIG. 2. Here, the EMIB 404 directly electrically couples with the CDR 430 and the TIA 432 of the EIC 408. In addition, there is a copper pillar 436 that directly electrically couples the EMIB 404 with the RDL 406, which may be similar to RDL 206 of FIG. 2.

In addition, the substrate 402, which may be similar to substrate 202 of FIG. 2, may be electrically coupled with the TIA 432 and DRV 434 via solder balls 437. In embodiments, the RDL 406 may be directly electrically coupled with the substrate 402 via one or more copper pillars 439. In addition, the PIC 410 may be directly electrically coupled with the RDL 406 via one or more solder balls 411. In embodiments, the electrical connection may be via pads, pins, or some other electrical connection technique.

Figure 5:
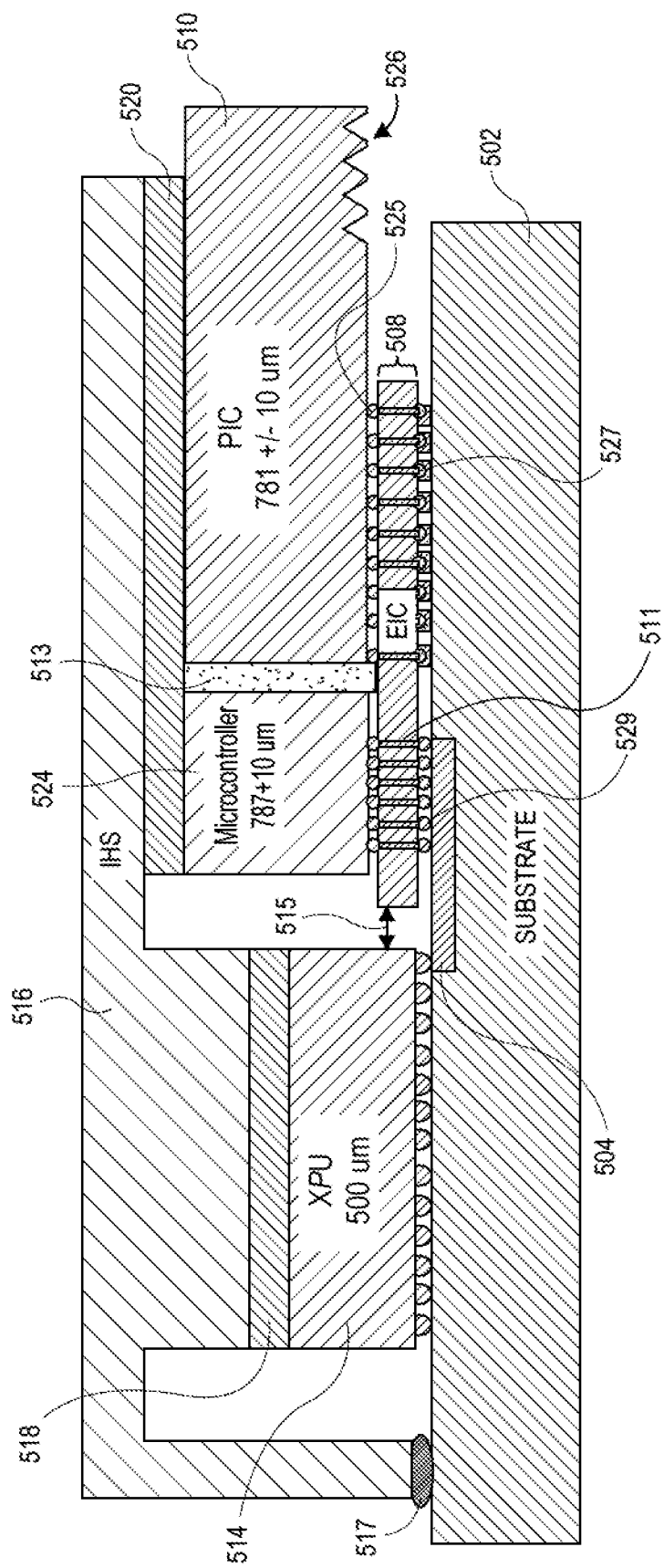
FIG. 5 illustrates a cross-section of an example integrated PIC and processor IC package that includes an electrical integrated circuit (EIC), in accordance with various embodiments.

FIG. 5 illustrates a cross-section of an example integrated PIC and processor IC package that includes an electrical integrated circuit (EIC), in accordance with various embodiments. Package 500 may be similar to package 200 of FIG. 2. However, the RDL 206 of FIG. 2 is not included. As shown, EIC 508 is electrically coupled with the substrate 502 using bumps 527. In some embodiments, bumps 527 may have a pitch of 100-130 μm. The EIC 508 is also electrically coupled with the PIC 510, with bumps 525. In some embodiments, the bumps 525 may have a pitch of 130 μm. In embodiments, the PIC 510 may include "V" grooves 526 or other shaped grooves to facilitate coupling of optical fibers (not shown) with the PIC 510 for the transmission of light signals.

The EIC 508 is also coupled with microcontroller 524, which may be electrically coupled using through silicon vias (TSV) 511 through the EIC 508 to the EMIB 504. In some embodiments, the TSV pitch area may be 55 μm over 2.5×9 mm. The EIC 508 may also electrically coupled with the EMIB 504 using bumps 529. In some embodiments, the bump 529 pitch may be on the order of 45-55 μm.

In embodiments, the microcontroller 524 and the PIC 510 may be separated by a block 513. In embodiments, this block may be a thermal barrier between the microcontroller 524 and the PIC 510. In embodiments, a TIM 520 may be in thermal contact with the microcontroller 524 and the PIC 510 to draw heat into the IHS 516.

In embodiments, the XPU 514 is electrically coupled with the EMIB 504. In addition, a TIM 518 may be thermally coupled with the XPU 514 and thermally coupled with the IHS 516. In embodiments, the IHS 516 may be separated from the substrate 502 by a sealant 517. The XPU 514 may be separated from the EIC 508 by a distance 515. In some embodiments, that distance 515 may be 240 μm. In some embodiments, the EIC 508 thickness may be on the order of 100 μm. In some embodiments, an X-Y dimension of the EIC 508 may be 10 mm×9 mm.

Figure 6:
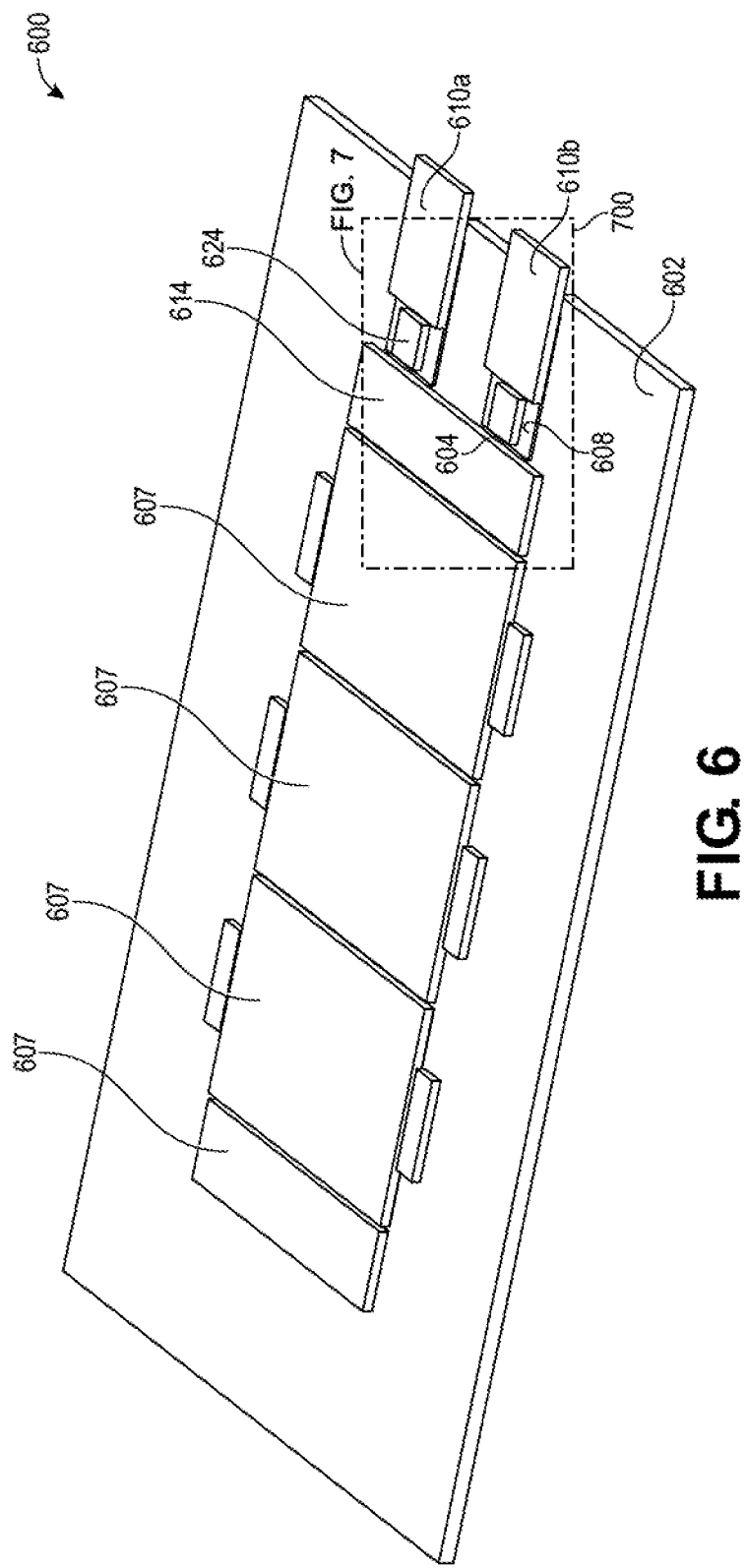
FIG. 6 illustrates a perspective view of an example integrated PIC and processor IC package, in accordance with various embodiments.

FIG. 6 illustrates a perspective view of an example integrated PIC and processor IC package, in accordance with various embodiments. Package 600 may be similar to package 100 of FIG. 1, package 200 of FIG. 2, package 300 of FIG. 3, package 400 of FIG. 4, or package 500 of FIG. 5. Substrate 602, which may be similar to substrate 102 of FIG. 1, as multiple dies 607, 614 coupled with the substrate 602 and electrically coupled with each other via one or more EMIB, which may be similar to EMIB 604. An I/O die 614, which may be similar to XPU 414 of FIG. 4, is coupled via EMIB 604 with an EIC 608, which may be similar to EIC 508 of FIG. 5. EIC 608 is coupled with another die 624, which may be similar to the other die 224 of FIG. 2, and is also coupled with a PIC 610*a*, 610*b*, which may be similar to PIC 410 of FIG. 4. This is shown in greater detail with respect to diagram 700 of FIG. 7.

Figure 7:
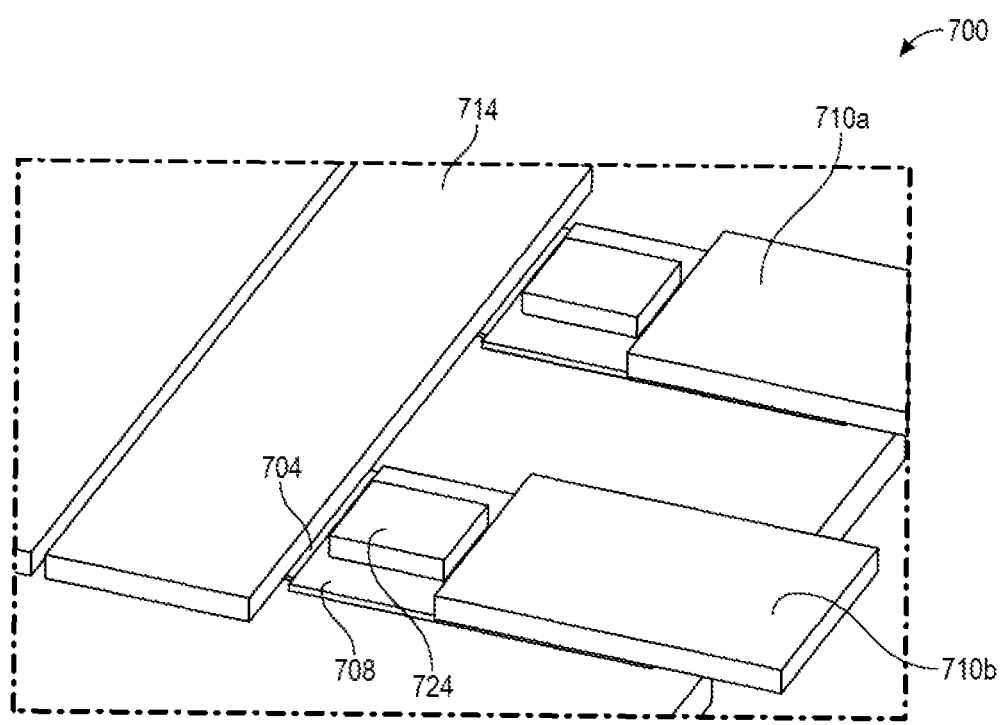
FIG. 7 illustrates a zoomed in perspective view of an example integrated PIC and processor IC package, in accordance with various embodiments.

FIG. 7 illustrates a zoomed in perspective view of an example integrated PIC and processor IC package, in accordance with various embodiments. Diagram 700 shows I/O die 714, EMIB 704, EIC 708, other die 724, and PIC 710*a*, 710*b*, which may correspond to I/O die 614, EMIB 604, EIC 608, other die 624, and PIC 610*a*, 610*b* of FIG. 6. As shown, the other die 724 and the PIC 710*b* are directly and electrically coupled with the EIC 708. The EMIB 704 electrically couples the EIC 708 to the I/O die 714.

Figure 8:
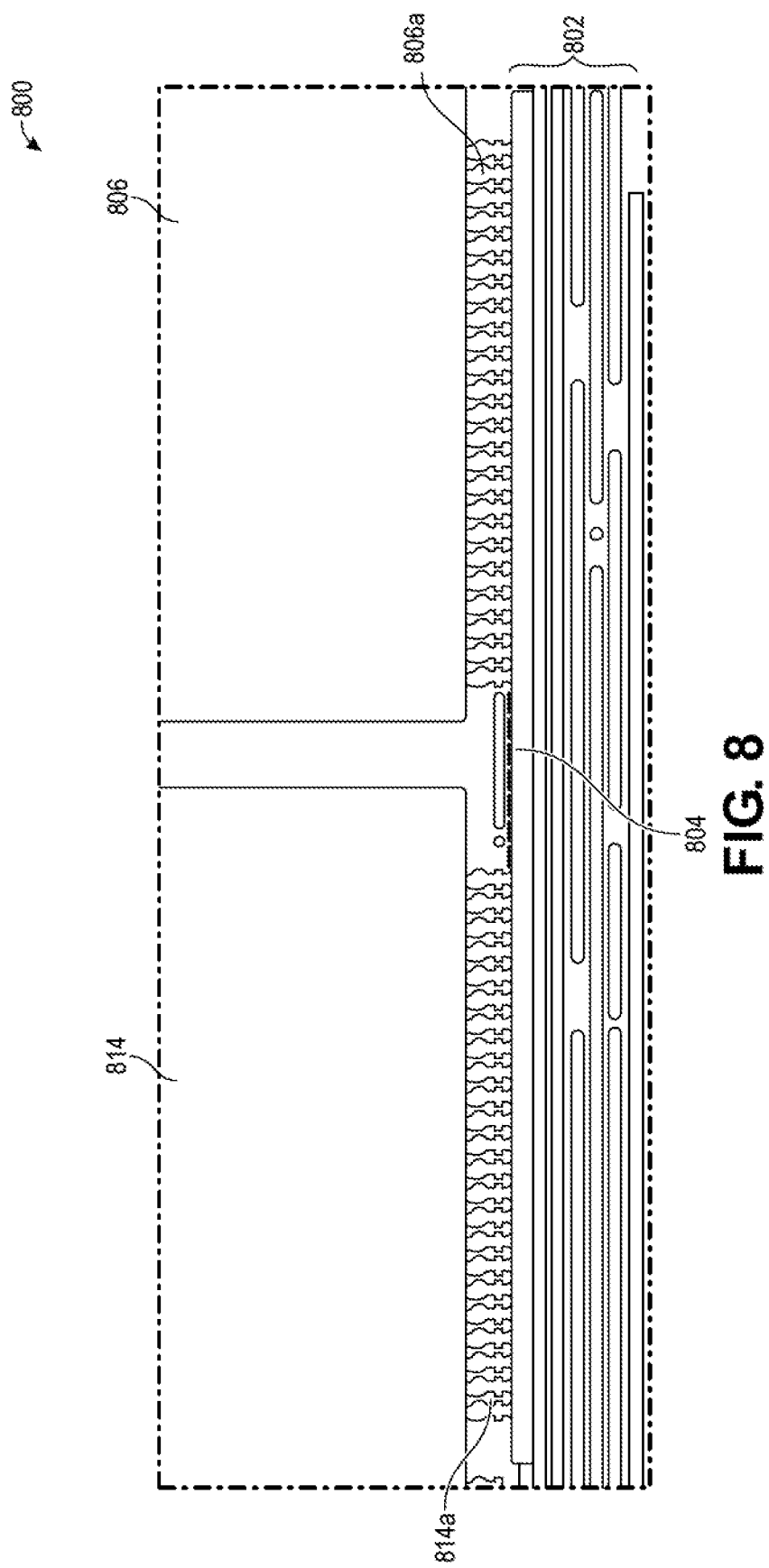
FIG. 8 illustrates a photo of an example integrated PIC and a processor IC package, in accordance with various embodiments.

FIG. 8 illustrates a photo of an example integrated PIC and a processor IC package, in accordance with various embodiments. In embodiments, these photos may be captured using a scanning electron microscope (SEM), which is a type of microscope that uses a focused beam of electrons to scan a surface of a sample to create a high resolution image. SEM produces images that can show information about the surface composition and topography of the material, in particular of a slice of a package. Package 800 shows an example of how embodiments described and referred to herein may be identified in produced packages. Package 800 is a schematic of a side view SEM photograph that includes two top dies 814, 806 that are electrically coupled to a substrate 802, which may be similar to substrate 102 of FIG. 1. The top dies 814, 806 are coupled with the substrate 802 using pins 814*a*, 806*a*. The top dies 814, 806 are electrically coupled via an EMIB 804, which may be similar to EMIB 104 of FIG. 1. The EMIB is embedded in the substrate 802.

Figure 9:
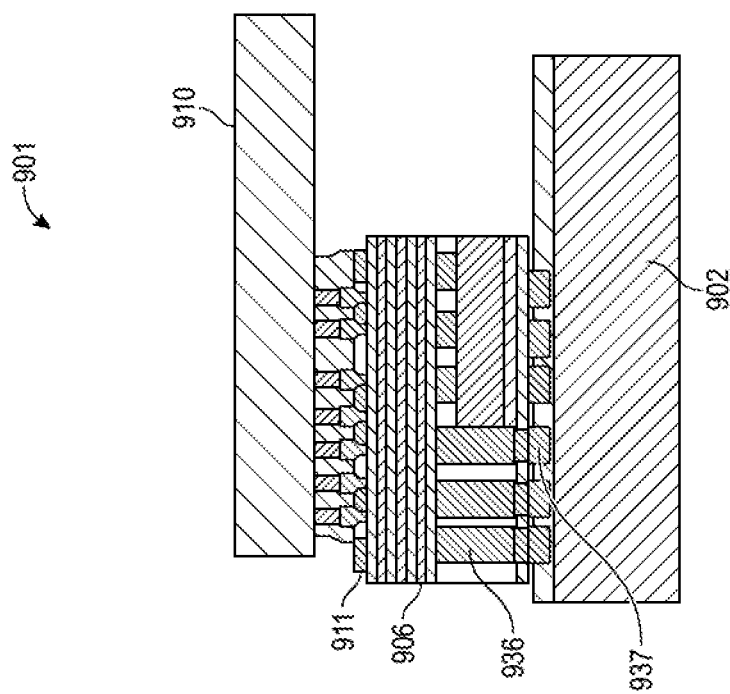
FIG. 9 illustrates a photo of an example PIC coupled with a fan out redistribution layer (FORDL), in accordance with various embodiments.
Figure 9:
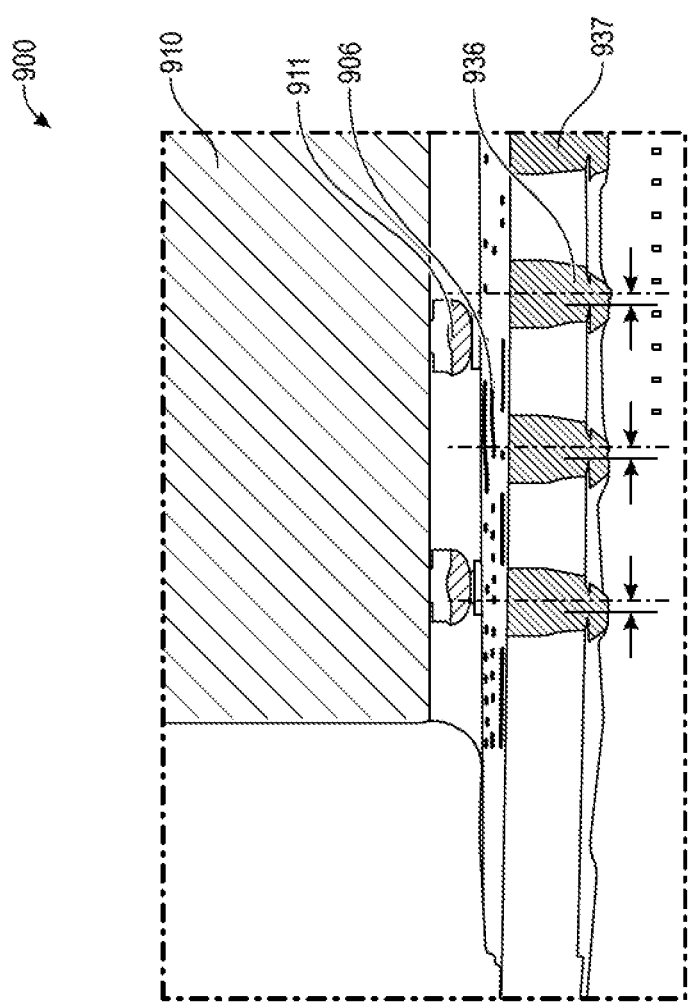

FIG. 9 illustrates a photo of an example PIC coupled with a FORDL, in accordance with various embodiments. Diagram 900 is an example diagram of a side view SEM photograph of an embodiment of a sliced photonics package that includes embodiments described and referred to herein, and may be identified in produced packages. Diagram 901 shows components that may be similar to components with respect to package 200 of FIG. 2.

As shown, bumps 937 on substrate 902 onto which copper pillars 936, which may be similar to copper pillars 220 of FIG. 2, are stacked may be clearly seen in diagrams 900, 901. The RDL 906, which may be similar to RDL 206 of FIG. 2, is electrically coupled with the PIC 910, which may be similar to PIC 210 of FIG. 2, via solder bumps 911. In addition, PIC 910 shows an overhang of a few millimeters beyond the edge of substrate 902. In embodiments, this overhang may include "V" grooves with fibers that may be placed in these grooves to couple light from the PIC 910. Thus, FIG. 8 and FIG. 9, show a few examples of ways that embodiments of the invention may be detected in production packages.

Figure 10:
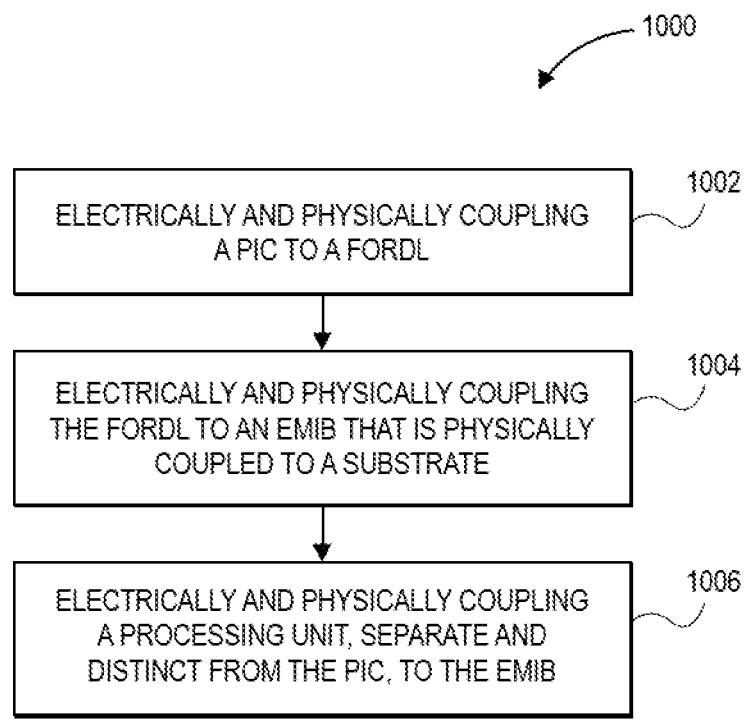
FIG. 10 is an example process for constructing an integrated PIC and a processor IC package that includes a FORDL, in accordance with various embodiments.

FIG. 10 is an example process for constructing an integrated PIC and a processor IC package that includes a FORDL, in accordance with various embodiments. Process 1000 may be implemented by one or more of the techniques, apparatus, or processes described herein and in particular with respect to FIGS. 1-9.

At block 1002, the process includes electrically and physically coupling a PIC to a FORDL. In embodiments, the PIC may be similar to PIC 110, 210, 310, 410, 510, 610a, 610b, 710a, 710b of FIGS. 1-7, and FORDL may be similar to RDL 106, 206, 306, 406, 906 of FIGS. 1-4 and 9. The FORDL performs at least the function of fanning out a redistribution layer to allow electrical connections on the PIC to be spread around a larger area than the footprint the PIC may have on the RDL. In embodiments, the routings on the FORDL allow designers to route connections wherever they want within the package.

At block 1004, the process may further include electrically and physically coupling the FORDL to an EMIB that is physically coupled to a substrate. In embodiments, the EMIB may include EMIB 104, 204, 304, 404, 504, 604, 704, 804 of FIGS. 1-8, and the substrate may include substrate 102, 202, 402, 502, 602, 802, 902 of FIGS. 1-2, 4-6, and 8-9. The FORDL in conjunction with the EMIB allows design flexibility and high-speed coupling between the PIC and the process unit, described below, within a single package.

At block 1006, the process may further include electrically and physically coupling a processing unit, separate and distinct from the PIC, to the EMIB. In embodiments, the processing unit may be similar to XPU 114, 214, 314, 414, 614, 814 of FIGS. 1-4, 6, and 8. In embodiments, the XPU may be a general or specific processing unit, and may include, but is not limited to, a CPU, GPU, or FPGA.

Other embodiments may include electrically and physically coupling an EIC, such as EIC 108 of FIG. 1, into one or more components of the package. Other embodiments may also include multiple XPU or PIC chips in the package. Other embodiments may include integrated heat spreaders that are part of the package, that are thermally coupled to one or more components of the package, such as the XPU or the PIC.

Figure 11:
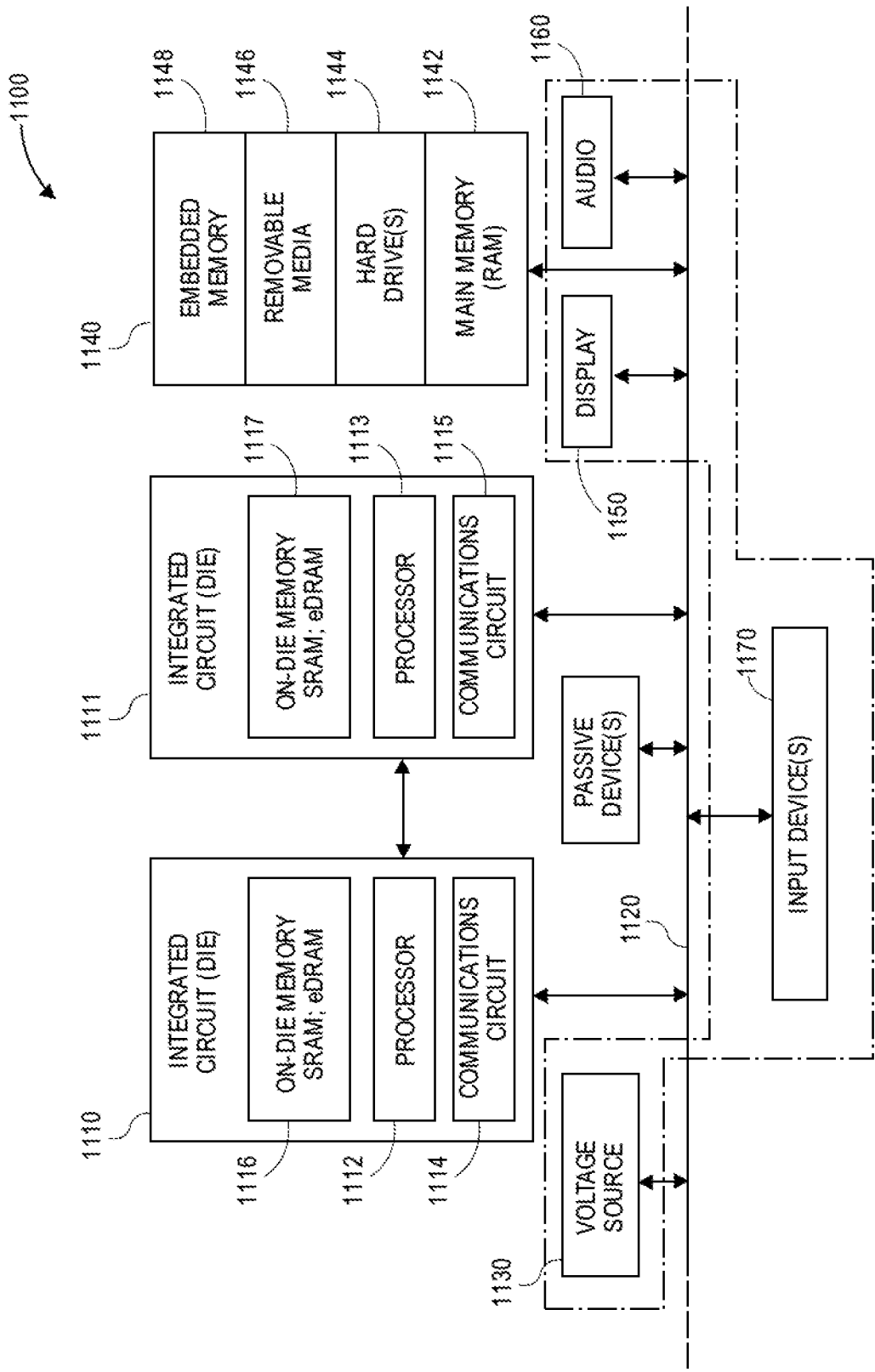
FIG. 11 schematically illustrates a computer system, in accordance with embodiments.

FIG. 11 schematically illustrates a computer system, in accordance with embodiments. The computer system 1100 (also referred to as the electronic system 1100) as depicted can embody all or part of an integrated photonics and processor package with redistribution layer and EMIB connector, according to any of the several disclosed embodiments and their equivalents as set forth in this disclosure. The computer system 1100 may be a mobile device such as a netbook computer. The computer system 1100 may be a mobile device such as a wireless smart phone. The computer system 1100 may be a desktop computer. The computer system 1100 may be a hand-held reader. The computer system 1100 may be a server system. The computer system 1100 may be a supercomputer or high-performance computing system. The computer system 1100 may be an AI cluster used for machine learning In an embodiment, the electronic system 1100 is a computer system that includes a system bus 1120 to electrically couple the various components of the electronic system 1100. The system bus 1120 is a single bus or any combination of busses according to various embodiments. The electronic system 1100 includes a voltage source 1130 that provides power to the integrated circuit 1110. In some embodiments, the voltage source 1130 supplies current to the integrated circuit 1110 through the system bus 1120.

The integrated circuit 1110 is electrically coupled to the system bus 1120 and includes any circuit, or combination of circuits according to an embodiment. In an embodiment, the integrated circuit 1110 includes a processor 1112 that can be of any type. As used herein, the processor 1112 may mean any type of circuit such as, but not limited to, a microprocessor, a microcontroller, a graphics processor, a digital signal processor, or another processor. In an embodiment, the processor 1112 includes, or is coupled with, all or part of an integrated photonics and processor package with redistribution layer and EMIB connector, as disclosed herein. In an embodiment, SRAM embodiments are found in memory caches of the processor. Other types of circuits that can be included in the integrated circuit 1110 are a custom circuit or an application-specific integrated circuit (ASIC), such as a communications circuit 1114 for use in wireless devices such as cellular telephones, smart phones, pagers, portable computers, two-way radios, and similar electronic systems, or a communications circuit for servers. In an embodiment, the integrated circuit 1110 includes on-die memory 1116 such as static random-access memory (SRAM). In an embodiment, the integrated circuit 1110 includes embedded on-die memory 1116 such as embedded dynamic random-access memory (eDRAM).

In an embodiment, the integrated circuit 1110 is complemented with a subsequent integrated circuit 1111. Useful embodiments include a dual processor 1113 and a dual communications circuit 1115 and dual on-die memory 1117 such as SRAM. In an embodiment, the dual integrated circuit 1110 includes embedded on-die memory 1117 such as eDRAM.

In an embodiment, the electronic system 1100 also includes an external memory 1140 that in turn may include one or more memory elements suitable to the particular application, such as a main memory 1142 in the form of RAM, one or more hard drives 1144, and/or one or more drives that handle removable media 1146, such as diskettes, compact disks (CDs), digital variable disks (DVDs), flash memory drives, and other removable media known in the art. The external memory 1140 may also be embedded memory 1148 such as the first die in a die stack, according to an embodiment.

In an embodiment, the electronic system 1100 also includes a display device 1150, an audio output 1160. In an embodiment, the electronic system 1100 includes an input device such as a controller 1170 that may be a keyboard, mouse, trackball, game controller, microphone, voice-recognition device, or any other input device that inputs information into the electronic system 1100. In an embodiment, an input device 1170 is a camera. In an embodiment, an input device 1170 is a digital sound recorder. In an embodiment, an input device 1170 is a camera and a digital sound recorder.

As shown herein, the integrated circuit 1110 can be implemented in a number of different embodiments, including all or part of an integrated photonics and processor package with redistribution layer and EMIB connector, according to any of the several disclosed embodiments and their equivalents, an electronic system, a computer system, one or more methods of fabricating an integrated circuit, and one or more methods of fabricating an electronic assembly that includes a package substrate implementing all or part of an integrated photonics and processor package with redistribution layer and EMIB connector, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed processes used for an integrated photonics and processor package with redistribution layer and EMIB connector embodiments and their equivalents. A foundation substrate may be included, as represented by the dashed line of FIG. 11. Passive devices may also be included, as is also depicted in FIG. 11.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 may is package comprising: a photonic integrated circuit (PIC); a redistribution layer (RDL) electrically coupled with the PIC; and an interconnect bridge coupled to a substrate, the interconnect bridge electrically coupled with the RDL, the RDL to extend electrical connections of the PIC outside an area peripheral to the PIC.

Example 2 may include the package of example 1, further comprising a processing unit electrically coupled with the interconnect bridge to electrically couple the processing unit and the PIC.

Example 3 may include the package of example 2, wherein the processing unit is two or more processing units; and wherein the interconnect bridge is an embedded multi-die interconnect bridge (EMIB).

Example 4 may include the package of example 2, wherein the processing unit is a selected one of: a CPU, a GPU, an FPGA, or other specialized processor.

Example 5 may include the package of example 1, further comprising an electrical integrated circuit (EIC) that is electrically coupled with the RDL, the PIC, and the interconnect bridge.

Example 6 may include the package of example 5, wherein the EIC further includes a selected one or more of: a trans-impedance amplifier (TIA), a clock data recovery circuit (CDR), or a driver.

Example 7 may include the package of example 5, wherein the EIC includes a selected one or more of a through silicon via (TSV) or a copper pillar.

Example 8 may include the package of example 5, wherein the EIC is disposed between the PIC and the substrate.

Example 9 may include the package of example 5, wherein the EIC is disposed between the RDL and the substrate.

Example 10 may include the package of example 5, wherein the EIC is disposed between the PIC and the RDL.

Example 11 may include the package of any one of examples 1-10, wherein the RDL is a fan out RDL.

Example 12 may include the package of example 1, wherein the PIC is two or more PICS.

Example 13 may include the package of example 1, further comprising another die physically and electrically coupled with the RDL.

Example 14 is a method for creating a package, the method comprising: electrically and physically coupling a photonics integrated circuit (PIC) to a fan out redistribution layer (FORDL); electrically and physically coupling the FORDL to an interconnect bridge that is physically coupled to a substrate; and electrically and physically coupling a processing unit, separate and distinct from the PIC, to the interconnect bridge.

Example 15 may include the method of example 14, wherein the processing unit is a selected one of: a CPU, a GPU, an FPGA, or other specialized processor.

Example 16 may include the method of example 14, wherein the processing unit is two or more processing units, or wherein the PIC is two or more PICs.

Example 17 may include the method of example of any one of examples 14-16, wherein the interconnect bridge is only partially electrically coupled with the FORDL.

Example 18 is a system comprising: a package comprising: a photonic integrated circuit (PIC); a redistribution layer (RDL) electrically coupled with the PIC; an interconnect bridge coupled to a substrate, the interconnect bridge electrically coupled with the RDL, the RDL to extend electrical connections of the PIC outside an area peripheral to the PIC; and an electrical integrated circuit (EIC) that is electrically coupled with the RDL, the PIC, and the interconnect bridge to support operation of the PIC; and one or more fiber-optic cables coupled with the PIC to provide optical signals to the PIC.

Example 19 may include the system of example 18, the package further comprising an integrated heat spreader (IHS) thermally coupled with the PIC or thermally coupled with the processing unit.

Example 20 may include the system of any one of examples 18-20, wherein the RDL is a fan out RDL.

What is claimed is:
1. A package comprising:
a substrate;
an interconnect bridge on the substrate;
a redistribution layer (RDL) having a top side and a bottom side opposite the top side, wherein the bottom side of the RDL is on the interconnect bridge and electrically coupled with the interconnect bridge;
a photonic integrated circuit (PIC) coupled to the top side of the RDL, wherein the PIC is electrically coupled with the interconnect bridge;
an electrical integrated circuit (EIC) that is electrically coupled with the RDL, the PIC, and the interconnect bridge, wherein the EIC is vertically intervening between the PIC and the RDL; and
a processing unit on the interconnect bridge, wherein the PIC and the processing unit are electrically coupled through the RDL and the interconnect bridge.

2. The package of claim 1, wherein an electrical connection on the bottom side of the RDL is electrically coupled with the PIC and wherein the electrical connection is outside a footprint of the PIC.

3. The package of claim 1, wherein the processing unit is two or more processing units.

4. The package of claim 1, wherein the processing unit is a selected one of: a CPU, a GPU, an FPGA, or other specialized processor; and wherein the interconnect bridge is an embedded multi-die interconnect bridge (EMIB).

5. The package of claim 1, wherein the EIC further includes a selected one or more of: a trans-impedance amplifier (TIA), a clock data recovery circuit (CDR), or a driver.

6. The package of claim 1, wherein the EIC includes a selected one or more of: a through silicon via (TSV) or a copper pillar.

7. The package of claim 1, wherein the EIC is two or more EICs.

8. The package of claim 1, wherein the RDL is a fan out RDL.

9. The package of claim 1, wherein the PIC is two or more PICS.

10. The package of claim 1, further comprising another die physically and electrically coupled with the RDL.

11. A system comprising:
a package comprising:
a substrate;
an interconnect bridge on the substrate;
a redistribution layer (RDL) having a top side and a bottom side opposite the top side, wherein the bottom side of the RDL is on the interconnect bridge and electrically coupled with the interconnect bridge;
a photonic integrated circuit (PIC) coupled to the top side of the RDL, wherein the PIC is electrically coupled with the interconnect bridge;
a central processing unit on the interconnect bridge, wherein the PIC and the central processing unit are electrically coupled through the RDL and the interconnect bridge, wherein an electrical connection on the bottom side of the RDL is electrically coupled with the PIC and wherein the electrical connection is outside a footprint of the PIC in relation to the RDL; and
an electrical integrated circuit (EIC) electrically coupled with the RDL, the PIC, and the interconnect bridge, wherein the EIC is vertically intervening between the PIC and the RDL; and
a fiber-optic cable optically coupled with a portion of the PIC extending laterally beyond the RDL.

12. The system of claim 11, the package further comprising an integrated heat spreader (IHS) thermally coupled with the PIC or thermally coupled with the central processing unit.

* * * * *